United States Patent

Tanaka et al.

[11] Patent Number: 5,901,152
[45] Date of Patent: May 4, 1999

[54] THREE-VALUE DATA STORING SEMICONDUCTOR MEMORY SYSTEM

[75] Inventors: Tomoharu Tanaka, Yokohama; Toru Tanzawa, Ebina, both of Japan

[73] Assignee: Kabushiki Kaisha Toshiba, Kawasaki, Japan

[21] Appl. No.: 08/839,787

[22] Filed: Apr. 16, 1997

[30] Foreign Application Priority Data

Apr. 19, 1996 [JP] Japan ................................. 8-098422

[51] Int. Cl.$^6$ .................................................... G06F 11/00
[52] U.S. Cl. ............................................................ 371/21.1
[58] Field of Search ................................... 371/21.1, 21.2, 371/21.3, 21.4, 21.6; 365/201; 395/182.03

[56] References Cited

U.S. PATENT DOCUMENTS

5,570,315 10/1996 Tanaka et al. .
5,621,682 4/1997 Tanzawa et al. .

*Primary Examiner*—Vincent P. Canney
*Attorney, Agent, or Firm*—Oblon, Spivak, McClelland, Maier & Neustadt, P.C.

[57] ABSTRACT

A three-value data storing semiconductor memory system, which has a plurality of memory cells capable of storing a three-value data item, comprises a first interface for receiving a plurality of binary data items of a first type, each including $2^m$ binary data items (m=1, 2, 3, . . . ), from an external device, a control circuit for processing the binary data items of the first type input to the first interface, in units of 3k data items (k=1, 2, 3, ), converting each data unit consisting of 3k data items, to 4k binary data items of a third type, and outputting the binary data items of the third type in units of $2^n$ binary data items (n=0, 1, 2, 3, . . . ) as binary data items of a second type via a second interface.

20 Claims, 7 Drawing Sheets

F I G. 3    $2^n$-BIT DATA BUS LINE

THREE-VALUE DATA STORING SEMICONDUCTOR MEMORY SYSTEM

BACKGROUND OF THE INVENTION

The present invention relates to a three-value data storing semiconductor memory system which comprises a plurality of three-value data storing semiconductor memory devices and a circuit for controlling these semiconductor memory devices.

A so-called "three-value data storing semiconductor memory" is known which has memory cells, each capable of assuming three different data-storing states, and which can therefore have a high integration density. A nonvolatile semiconductor memory which stores three-value data is known. This semiconductor memory comprises a semiconductor substrate and MOS transistors. Each MOS transistor has a floating gate (a charge-storing section) and a control gate, both provided, one on the other, on the semiconductor substrate. Three different amounts of charge are accumulated, one at a time, in the charge-storing section of each memory cell. Each memory can therefore store a three-value data item.

Each memory cell of a three-value data storing semiconductor memory stores a three-value data item, for example, "0,""1" or "2." Hence, two memory cells are used to represent nine different data-storing states. Of these nine states, eight states defines data corresponding to a 3-bit binary data item. In other words, two memory cells cooperate to store a 3-bit data item in the three-value data storing semiconductor memory.

A 3-bit binary data item is converted to two 2-bit binary data items. Each 2-bit binary data item is a three-value data item, which is written into one memory cell by means of a data-writing circuit. The data-writing circuit operates under the control of the 2-bit binary data item. The three-value data item stored in each memory cell is converted into a 2-bit binary data item by a data-reading circuit. Two 2-bit binary data items read from two memory cells are converted into a 3-bit binary data.

Various semiconductor devices, such as CPUs, flash memories and DRAMs, have a data input/output interface for receiving and supplying $2^m$ binary data items (m=1, 2, 3, . . . ), e.g., eight binary data items or 16 binary data items, at the same time. If the $2^m$ binary data items are processed to provide 3-bit binary data items, there will remain 1-bit and/or 2-bit binary data items.

For example, if 8-bit binary data is processed to provide 3-bit binary data items, there will be obtained two 3-bit data items and one 2-bit data item. In this case, one bit may be added to the 2-bit data item, thereby forming a pseudo 3-bit data item. Thus, only six memory cells are required to store the 8-bit binary data. This means that the three-value data storing memory needs to have only three quarters (¾) the number of memory cells which a binary data storing memory have, in order to store the same amount of data. Hereinafter, the value of ¾ will be referred to as "data compression ratio."

If $2^m$, i.e., the number of binary data items used, is a multiple of 3, there will remain neither 1-bit binary data item nor 2-bit binary data items. However, the semiconductor memory needs to a circuit for converting $2^m$ binary data items, where $2^m$ is a multiple of 3, into three-value data items, and also a circuit for converting three-value data items into the $2^m$ binary data items, where $2^m$ is a multiple of 3. If necessarily provided with these circuits, the semiconductor memory will have its chip size inevitably increased.

In most types of semiconductor memories used at present, data-correction is effected if the data stored has been destroyed. If the data is stored in a three-value data storing memory, all bits of a 3-bit binary data item would become erroneous in the worst case. In some cases, this error may occur in two of the 3-bit binary data items which are output concurrently.

As indicated above, the conventional three-value data storing semiconductor memory in and from which $2^m$ binary data items are concurrently input and output has but a insufficient data compression ratio or needs to have complex circuits to attain a sufficient data compression ratio.

BRIEF SUMMARY OF THE INVENTION

The object of the present invention is to provide a three-value data storing semiconductor memory system which comprises three-value data storing semiconductor memories each having no complex data-converting circuits and yet having a sufficient data compression ratio, and which can therefore operate with high reliability.

According to the invention, there is provided a three-value data storing semiconductor memory system which has a plurality of memory cells capable of storing a three-value data item, is characterized by comprising: a first interface for receiving a plurality of binary data items of a first type, each including $2^m$ binary data items (m=1, 2, 3, . . . ), from an external device; a control circuit for processing the binary data items of the first type input to the first interface, in units of 3k data items (k=1, 2, 3, . . . ), converting each data unit consisting of 3k data items, to 4k binary data items of a third type, and outputting the binary data items of the third type in units of $2^n$ binary data items (n=0, 1, 2, 3, . . . ) as binary data items of a second type via a second interface. With this configuration, each of the memory cells stores one of three data-storing states, and the system further comprises: a third interface for receiving the binary data items of the second type; a memory cell array having the memory cells arranged in rows and columns; and a writing circuit for writing data items to the memory cells based on the binary data items of the second type. The binary data items of the third type converted from 3k binary data items of the first type are provided in the same number as the binary data items of the second type concurrently output through the second interface (4k=$2^n$).

According to the invention, there is provided another type of a three-value data storing semiconductor, which has a plurality of memory cells capable of storing a three-value data item, the system comprising: a first interface for concurrently receiving a plurality of binary data items of a first type, each including $2^n$ binary data items (n=0, 1, 2, 3, . . . ), from the memory cells; a control circuit for processing the binary data items of the first type input to the first interface, in units of 4h data items (h=1, 2, 3, . . . ), converting each data unit consisting of 4h data items, to 3h binary data items of a third type, and outputting the binary data items of the third type in units of $2^m$ binary data items of a second type (m=1, 2, 3, . . . ) as binary data items of a second type via a second interface to an external device. With this configuration, each of the memory cells stores one of three data-storing states, and the system further comprises: a memory cell array having the memory cells arranged in rows and columns; and a reading circuit for detecting the data-storing states of the memory cells and generating the binary data items of the first type which represent the data-storing states detected; and a third interface for outputting the binary data items of the first type to the first interface.

Preferred modes of the present invention are as follows:

(1) The binary data items of the third type converted from 3k binary data items of the first type are provided in the same number as the binary data items of the second type concurrently output through the second interface ($4k=2^n$).

(2) The binary data items of the first type converted to the 3h binary data items of the third type are provided in the same number as the binary data items of the first type concurrently input through the first interface ($4h=2^n$).

(3) The binary data items of the first type input through the first interface are provided in the same number as the binary data items of the second type concurrently output through the second interface ($n=m\ne0$).

(4) The system further comprises a plurality of memory devices including the memory cells, wherein the control circuit arranged simply corresponding to the plurality of the memory devices.

(5) The third interface receives and supplies the $2^n$ binary data items of a first type concurrently.

(6) A system in which the memory cells are non-volatile ones of MOSFET structure, each having a charge-storing layer and a control gate mounted on the charge-storing layer.

According to the invention, there is provided still another type of a three-value data storing semiconductor memory system, which comprises: a memory cell array having a memory section which comprises a plurality of memory cells capable of storing a three-value data item and arranged in rows and columns, for storing data signals and check signals; and a error-correction control circuit for generating check binary data items from a plurality of binary data items to be stored in the memory cells, for detecting whether any binary data item read from the memory section is erroneous in accordance with the binary data items and the check binary data items, and for correcting any binary data that has been found to be erroneous, wherein the error-correction control circuit decomposes a plurality of binary data items to be stored in the memory cells to a plurality of symbols in a unit of three times bit length, generates a plurality of check binary data items to be stored in the memory cells, and detects and corrects data items in a unit of the symbols according to the binary data items and the check binary data items read from the memory cells.

Preferred modes of this semiconductor memory system are as follows:

(1) The error-correction control circuit generates the check binary data items on the basis of a $2^9$RS (Read Solomon) code in which one symbol is constituted by nine bits, and detects and corrects an erroneous binary data item by using a 9-bit symbol.

(2) The binary data items have a bit length greater than 4096 bits.

(3) The error-correction control circuit generates the check binary data items on the basis of a $2^{12}$RS (Read Solomon) code in which one symbol is constituted by 12 bits, and detects and corrects an erroneous binary data item by using a 12-bit symbol.

(4) The binary data items have a bit length greater than 8192 bits.

Furthermore, in the system according to the invention, two of the memory cells store three bit data.

In the present invention, a control circuit is provided for a plurality three-value data storing memory devices. The control circuit converts data items input to a first interface before they are supplied to a second interface. Also does it convert data items input the second interface before they are supplied to the first interface. That is, the control circuit converts the data items input to the memory system to three-value data items, which are written into the memory devices, and converts the three-value data items read from the memory devices to data items, which are output from the memory system. Further, the control circuit processes decomposes the binary data stored in the three-value data storing memory devices, into symbols each consisting of 3k bits (k is 1, 2, 3, or not, and corrects any erroneous symbol found, in accordance with the associated check binary data item.

As described above, the three-value data storing semiconductor memory system according to the invention has no complex data-converting circuits and can yet attain a sufficient data compression ratio. The system can therefore operate with high reliability.

The control circuit is provided between the three-value storing memory devices, on the one hand, and an external device such as a CUP, on the other hand. The control circuit can convert binary data to binary data to be written/read, and vice versa. The memory system needs to have no complex data-converting circuits and can yet attain a sufficient data compression ratio and can therefore operate with high reliability.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

An embodiment of the present invention will be described, with reference to the accompanying drawings.

Figure 1:
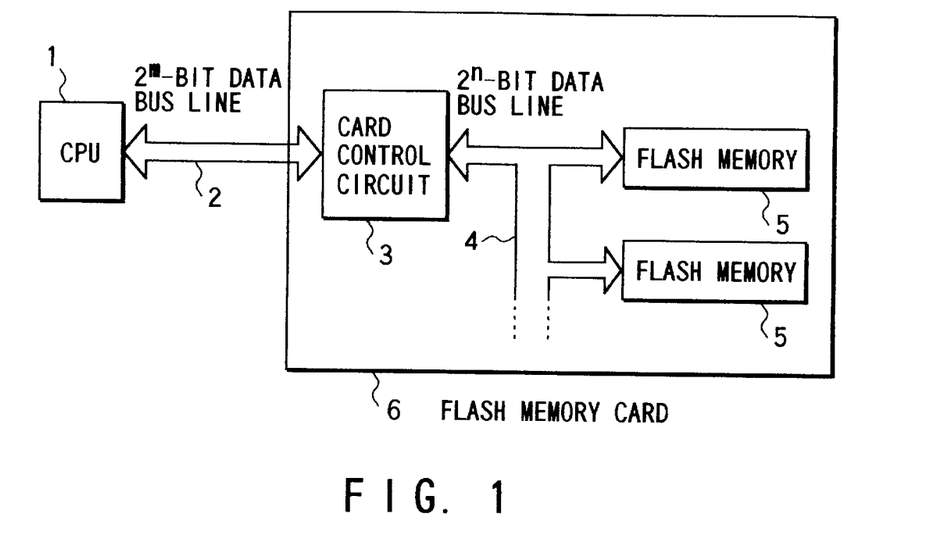
FIG. 1 is a block diagram showing a three-value data storing semiconductor memory system according to an embodiment of the present invention.

FIG. 1 shows a flash memory card 6 which is a three-value data storing semiconductor memory system according to this invention. When used, the flash memory card 6 is connected to a central processing unit (CPU) 1 by an $2^m$-bit data bus line 2. The $2^m$-bit data bus line 2 can transfer $2^m$ binary data items at a time (m=1, 2, 3, ... ). The flash memory card 6 incorporates a card control circuit 3, an $2^n$-bit data bus line 4, and a plurality of flash memories 5. Each flash memory 5 has a number of memory cells, each designed for storing a three-value data item. The flash memories 5 are connected to the card control circuit 3 by the 2-bit data bus line 4. The $2^N$n-bit data bus line 4 can transfer $2^n$ binary data items at a time (n=0, 1, 2, ... ).

The card control circuit 3 converts the binary data supplied via the $2^m$-bit data bus line 2 so that the data may be written into the flash memories 5. It also converts the data supplied via the $2^n$-bit data bus line 4 so that the data may be read from the flash memory card 6. Thus, a circuit need not be provided for each flash memory 5, for converting the data read from the flash memory 5 and the data to be written thereinto.

The card control circuit 3 and the flash memories 5 will be described in detail.

Figure 2:
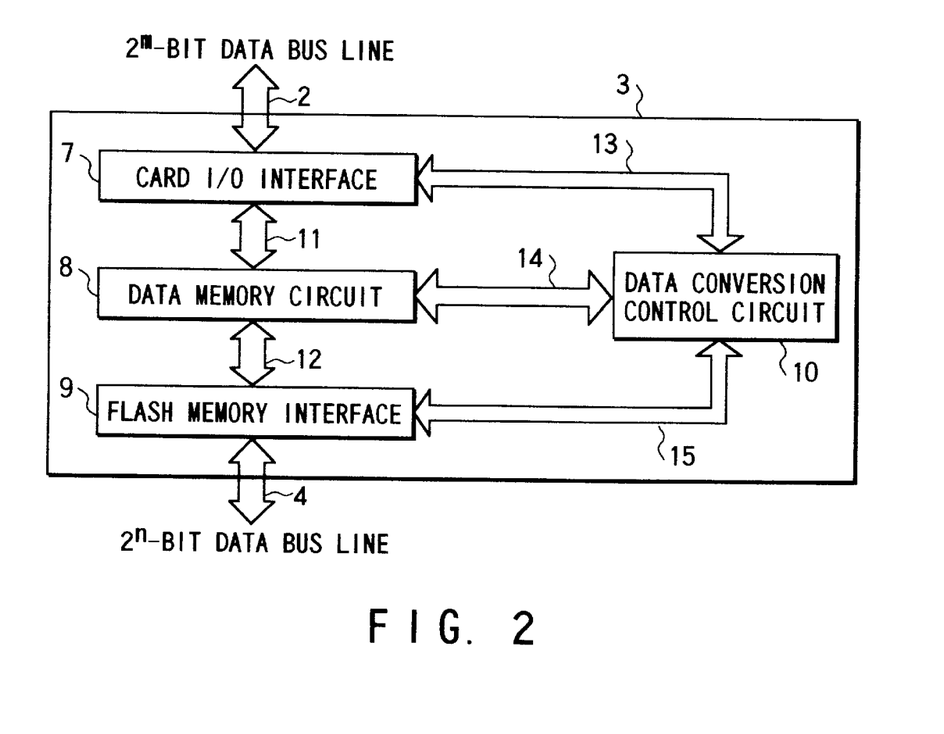
FIG. 2 is a block diagram illustrating the card control circuit incorporated in the memory system of FIG. 1.

The card control circuit 3 will be described first, with reference to FIG. 2. As shown in FIG. 2, the circuit 3 has a card I/O interface 7, a data memory circuit 8, a flash memory interface 9, and a data conversion control circuit 10. The $2^m$-bit data bus line 2 is connected to the card I/O interface 7 (the first input/output interface). The $2^m$ binary data items concurrently supplied to the flash memory card 6 can therefore be input to the card I/O interface 7 concurrently. Conversely, the $2^m$ binary data items to be concurrently supplied from the flash memory card 6 can be output from the card I/O interface 7 concurrently.

The $2^n$-bit data bus line 4 is connected to the flash memory interface 9 (the second input/output interface). The $2^n$ binary data items to be written into any flash memory 5 concurrently can therefore be output from the flash memory interface 9, concurrently. Also the $2^n$ binary data items read from the any flash memory 5 concurrently can be input to the flash memory interface 9 concurrently.

The $2^m$ binary data items concurrently input to the card I/O interface 7 are supplied via a bus line 11 to the data memory circuit 8 and temporarily stored in the memory circuit 8. These binary data items are converted to $2^n$ binary data items to be written. The $2^n$ binary data items are transferred to the flash memory interface 9 through a bus line 12. The $2^n$ binary data items are concurrently output from the interface 9 to the flash memories 5 through the $2^n$-bit data bus line 4.

The $2^n$ binary data items read from the flash memories 5 are input to the flash memory interface 9. These $2^n$ binary data items are converted to $2^m$ binary data items. These $2^m$ binary data items are transferred to the data memory circuit 8 through the bus line 12 and temporarily stored in the data memory circuit 8. Thereafter, the $2^m$ binary data items are transferred to the card I/O interface 7 and are concurrently output therefrom.

The conversion control circuit 10 incorporated in the card control circuit 3 is designed to generate signals for controlling the card I/O interface 7, data memory circuit 8 and flash memory interface 9. These signals are supplied from the circuit 10 to the interface 7, circuit 8 and interface 9 through control signal lines 13, 14 and 15, respectively. The card control circuit 3 receives a signal (not shown) input from the flash memory card 6 for controlling the flash memories 5 and controls the flash memories 5 in accordance with this signal. The circuit 3 outputs a signal representing the operating condition of the flash memory card 6, in addition to binary data items. The card control circuit 3 may not be an integrated unit as shown in FIG. 2. Rather, it may comprise several independent units.

Figure 3:
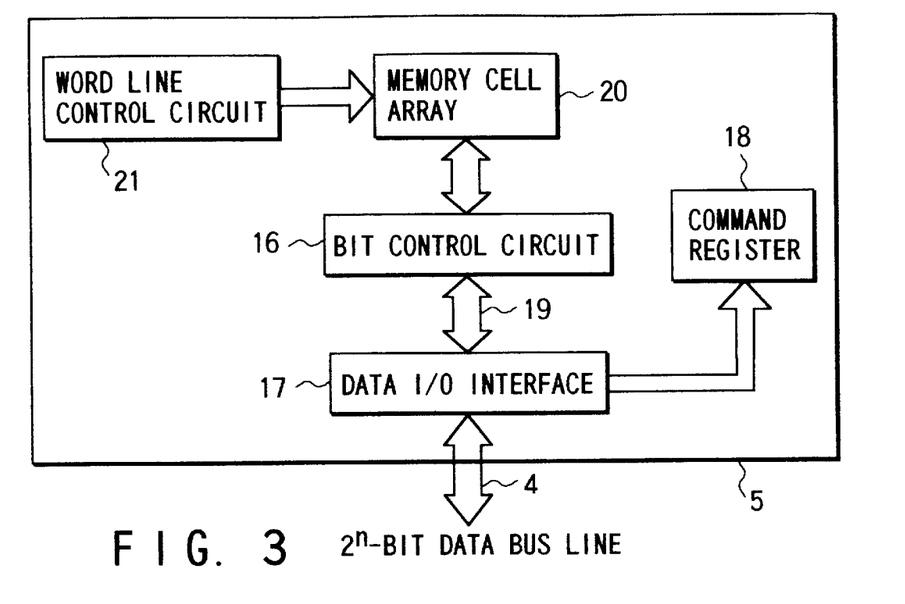
FIG. 3 is a block diagram illustrating one of the identical flash memories built in the memory system of FIG. 1.

The flash memories 5 are identical, each having the structure illustrated in FIG. 3.

Each flash memory 5 comprises a bit line control circuit 16, a data I/O interface 17 (the third interface), a command register 18, a memory cell array 20, and a word line control circuit 21. The memory cell array 20 comprises a number of memory cells arranged in rows and columns. Each memory cell can store a three-value data item. The bit line control circuit 16 is designed to control the bit lines of the memory cell array 20. The word line control circuit 21 is provided to control the word lines of the memory cell array 20.

The $2^n$-bit data bus line 4 is connected to the data I/O interface 17. The $2^n$ binary data items to be written into the flash memory 5 are concurrently transferred to the bit line control circuit 16 through the data I/O interface 17 and a bus line 19. The bit line control circuit 16 controls the bit lines of the memory cell array 20 in accordance with the binary data items it has received, thereby writing three-value data items into the memory cells.

Whenever desired, the three-value data items stored in the memory cells are read by the bit line control circuit 16 via the bit line, and are converted to binary data items. The binary data items to be read are output to the $2^n$-bit data bus line 4 via the data I/O interface 17 and the bus line 19, in units of $2^n$ items. In this embodiment, the binary data items are written into and read from the flash memory 5, in units of $2^n$ items. Nevertheless, if n≧1, the binary data items may be concurrently written and read in units of 2i items (i=0, 1, ... , n-1). In this case, the 2i binary data items are concurrently written into and read from $2^{(n-i)}$ flash.

The command register 18 is connected to the data I/O interface 17. A flash memory control command, which is output from the card control circuit, for controlling the flash memory 5, is transferred to the command register 18 through the $2^n$-bit data bus line 4 and the data I/O interface 17.

Figure 4:
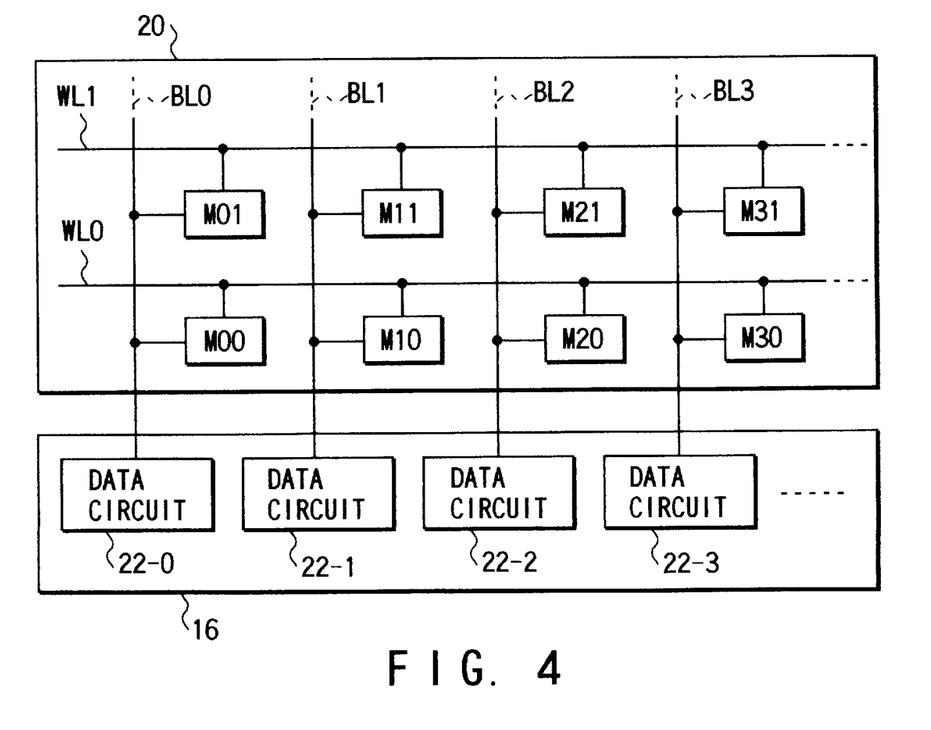
FIG. 4 is a block diagram showing the memory cell array and the bit line control circuit, both provided in the memory system of FIG. 1.

The memory cell array 20 and bit line control circuit 16 of each flash memory 5 will be described in detail, with reference to FIG. 4. As shown in FIG. 4, the memory cell array 20 has word lines $WL_p$ (p=0, 1, 2, 3, ... ), bit lines $BL_q$ (q=0, 1, 2, 3, ... ), and memory cells $M_{qp}$. The memory cells $M_{qp}$ are arranged at the intersections of the word lines $WL_p$ and the bit lines $BL_q$. As shown in FIG. 4, the bit line control circuit 16 comprises data circuits 22-q, which are connected to the bit lines $BL_q$, respectively.

The binary data items to be written input to the data I/O interface 17 of the flash memory 5 are supplied to the data circuits 22. The data circuits 22 control the bit lines BL in accordance with the binary data items to be written, thereby writing three-value data items into the memory cells M. Whenever necessary, the three-value data items are read from the memory cells M to the data circuits 22-q via the bit liens BL. They are then supplied through the data I/O interface 17 and output from the flash memory 5.

Since the present embodiment is a flash memory card, the memory cells are electrically erasable and programmable non-volatile ones. The three-value data storing semiconductor memory system according to the present invention may be, for example, a DRAM card. If this is the case, the memory cells will be DRAM cells.

Figure 5:
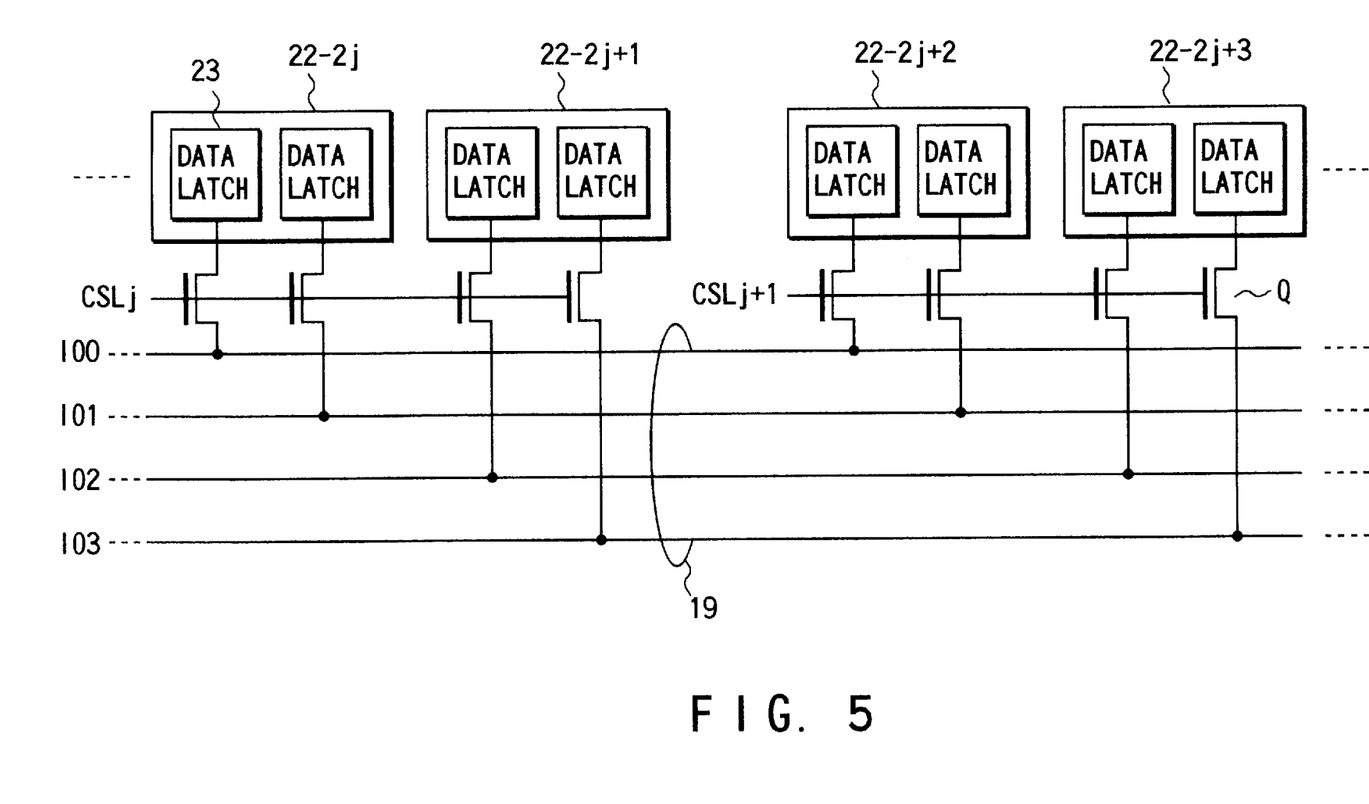
FIG. 5 is a diagram illustrating, in detail, the bit line control circuit shown in FIG. 4.

The data circuits 22 and the bus line 19 will be described in detail, with reference to FIG. 5. As seen from FIG. 5, each of the data circuit 22 has two data latches 23, each capable of storing one bit. The bus line 19 is comprised of four IO lines IO0 to IO3, but may be comprised of less or more than four IO lines. Each data latch 23 is connected one IO line by an n-channel MOS transistor Q.

A column-selecting signal $CSL_j$ (j=0, 1, 2, . . . ) is supplied to the four n-channel MOS transistors Q which connect the data latches 23 of any two adjacent data circuits 22 to the IO lines IO0 to IO3. The binary data items on the bus line 19 are transferred to the data latches 23 when the column-selecting signal $CSL_j$ supplied to the n-channel MOS transistors Q is set at "H" level. The binary data items are selectively output from the data latches 23 to the IO lines when the signal $CSL_j$ supplied to the transistors Q connected to the data latches 23 is set at "H" level.

Figure 6:
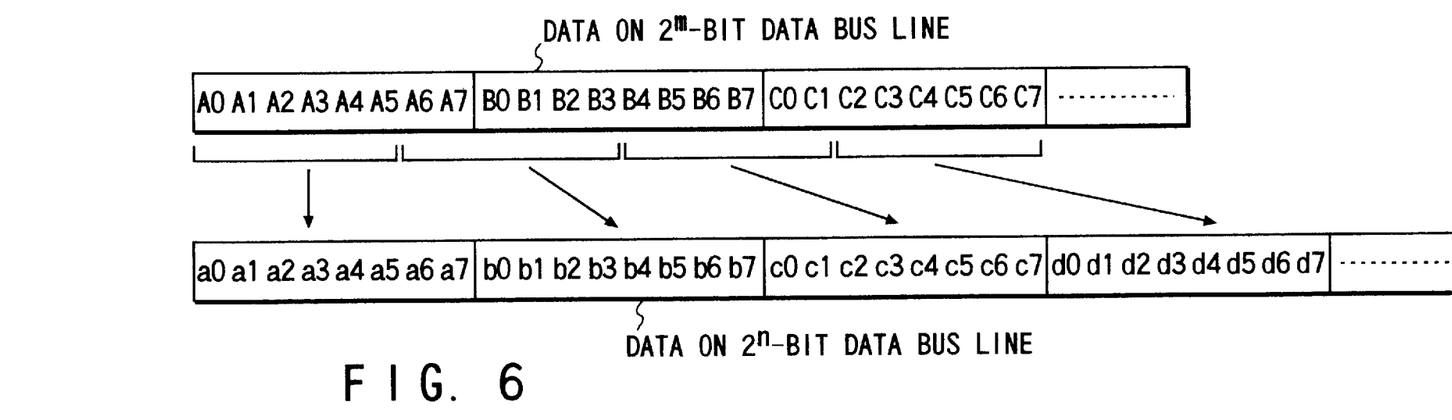
FIG. 6 is a diagram explaining how data to be written is converted in the memory system of FIG. 1.

The 3-bit binary data items (INFO0, INFO1, INFO2) on the $2^m$-bit data bus line 2, the 4-bit binary data items (DATA0, DATA1, DATA2, DATA3) on the $2^n$-bit data bus line 4, which are to be written into the memory cells or which have been read from the memory cells, and two three-value data items stored in two memory cells connected to the same word line, e.g., three-value data items (DATAM00, DATAM10) stored in the memory cells M00 and M10, are as shown in the following table:

a7. The bits a0 to a7 thus obtained constitute an 8-bit binary data item to be written. These bits a0 to a7, i.e., the 8-bit binary data item, are concurrently output from the flash memory interface 9.

An 8-bit binary data item consisting of bits B0 to B7, an 8-bit binary data item consisting of bits C0 to C7, and so on are input to the card I/O interface 7 at the same time the first 8-bit binary data item (bits A0 to A7) is input. The bits A6 and A7 of the first binary data item and the first bit B0 of the second 8-bit binary data B0 to B7 input to the card I/O interface 7 are converted to four bits b0 to b3. The bits B1 to B3 of the second 8-bit binary data item are converted to four bits b4 to b7. The bits b0 to b7, constituting an 8-bit binary data item, are concurrently output from the flash memory interface 9. Further, the bits B4 to B6 are converted to four bits c0 to c3, and the last bit B7 of the second 8-bit binary data item and the first two bits C1 and C3 of the third 8-bit binary data item are converted to four bits c4 to c7. The bits c0 to c7, constituting an 8-bit binary data item, are concurrently output from the flash memory interface 9. The bits C2 to C4 of the third 8-bit binary data item are converted to four bits d0 to d3, while the bits C5 to C7 are converted to four bits d4 to d7. The bits b0 to b7, c0 to c7, and d0 to d7, each constituting an 8-bit binary data item, are concurrently output from the flash memory interface 9, respectively.

That is, the $2^m$ binary data items stored in the data memory circuit 8 are divided into 3-bit data items. Each 3-bit data item, thus obtained, is converted to a 4-bit data item to be written. Thus, each 8-bit binary data item can be stored in the memory cells, in the form of some three-value

TABLE

| INF00 | INF01 | INF02 | DATA0 | DATA1 | DATA2 | DATA3 | DATAM00 | DATAM10 |
|---|---|---|---|---|---|---|---|---|
| 0 | 0 | 0 | 0 | 0 | 0 | 0 | 0 | 0 |
| 0 | 1 | 0 | 0 | 0 | 0 | 1 | 0 | 1 |
| 0 | 1 | 0 | 0 | 0 | 1 | 1 | 0 | 2 |
| 0 | 1 | 1 | 0 | 1 | 0 | 0 | 1 | 0 |
| 1 | 0 | 0 | 0 | 1 | 0 | 1 | 1 | 1 |
| 1 | 0 | 1 | 0 | 1 | 1 | 1 | 1 | 2 |
| 1 | 1 | 0 | 1 | 1 | 0 | 0 | 2 | 0 |
| 1 | 1 | 1 | 1 | 1 | 0 | 1 | 2 | 1 |

As can be understood from the table, two memory cells M cooperate to store one 3-bit binary data item. Since the binary data item written into and read from one memory cell consists of two bits, the card control circuit 3 controls data conversion, from one 3-bit binary data item to one 4-bit read or write binary data item, and vice versa.

As seen from the table, the write binary data item and the read binary data item are identical. They may be different since they are respectively written into and read from the flash memory card 6, provided that they correspond to the three-value data items stored in the memory cells. Furthermore, the binary data items, the write/read binary codes, and the three-value data items stored in the memory cells may have be provided in combination different from that shown in the table, so long as they correspond to one another.

FIG. 6 is a diagram explaining how $2^m$-bit binary data items are converted to $2^n$-bit binary data items in the card control circuit 3, in the case where m=n=3. An 8-bit binary data item consisting of bits A0 to A7 is input to the card I/O interface 7. Of the eight bits A0 to A7 of the first binary data item, the first three bits A0 to A2 are converted to four bits a0 to a3, and the next three bits A3 to A5 to four bits a4 to data items. In other words, the 8-bit binary data item can be stored in the memory cells, at a sufficient data compression ratio. Each 4-bit binary data item to be written may be divided into two 2-bit data items or into four 1-bit data items. The 2-bit data items or 1-bit data items, thus obtained, are concurrently transferred to the flash memory 5. Moreover, m may not be equal to n (m≠n).

If m=4 and n=3, for example, 16-bit binary data input to the card control circuit 3 is converted to four 3-bit data items to be written, and two 4-bit data items are concurrently output from the circuit 3. Thus, the present invention can be reduced to practice, as long as m is a natural number and n is a non-negative integer.

Figure 7:
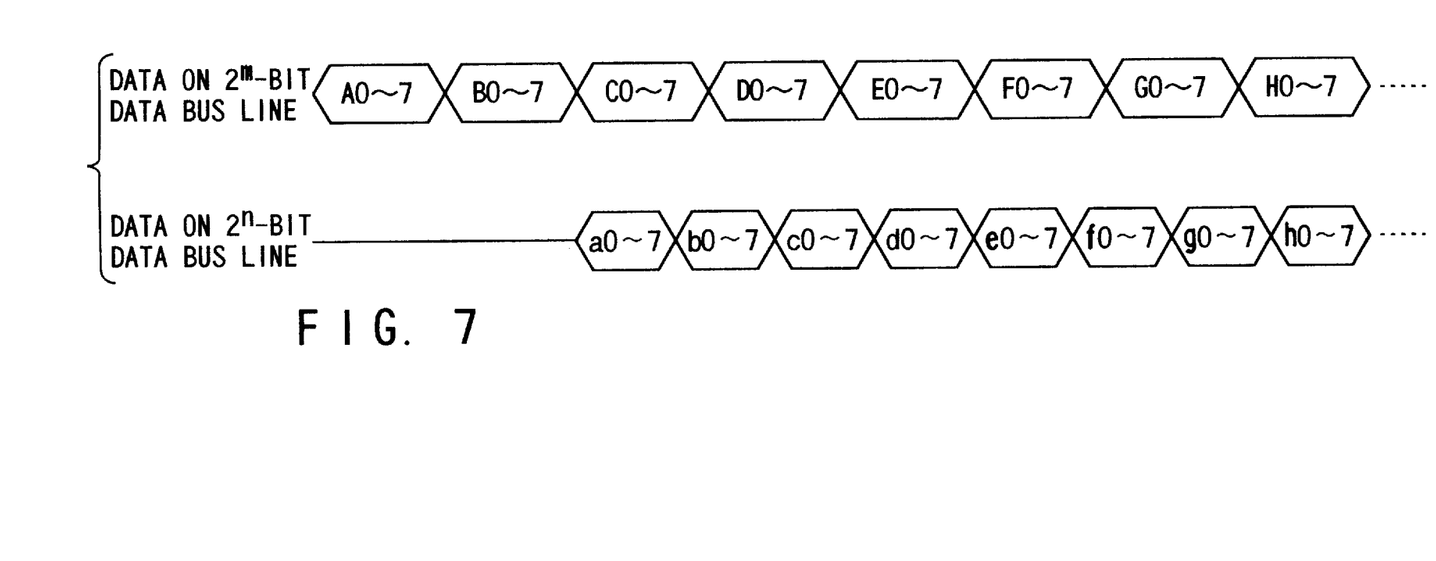
FIG. 7 is a timing chart illustrating when data is converted in the memory system of FIG. 1.

FIG. 7 is a timing chart illustrating when data is converted in the card control circuit 3, in the case where m=n=3 like as FIG. 6. Eight-bit binary data items, i.e., bits A0 to A7, B0 to B7, C0 to C7, D0 to C7, . . . , are concurrently input to the card I/O interface 7, one after another. Then, the binary data items a0 to a7 to be written are output after the binary data items A0 to A7 are input. Successively, the binary data items b0 to b7 to be written are output after the binary data items B0 to B7 are input. The following operation is the same as above and the explanation will be omitted.

The cycle of inputting data to the card I/O interface 7 and the cycle of outputting data from the flash memory interface 9 can be adjusted, thereby to equalize the time required for input all binary data items and the time required to output all binary data items to be written as shown in FIG. 7.

Figure 8:
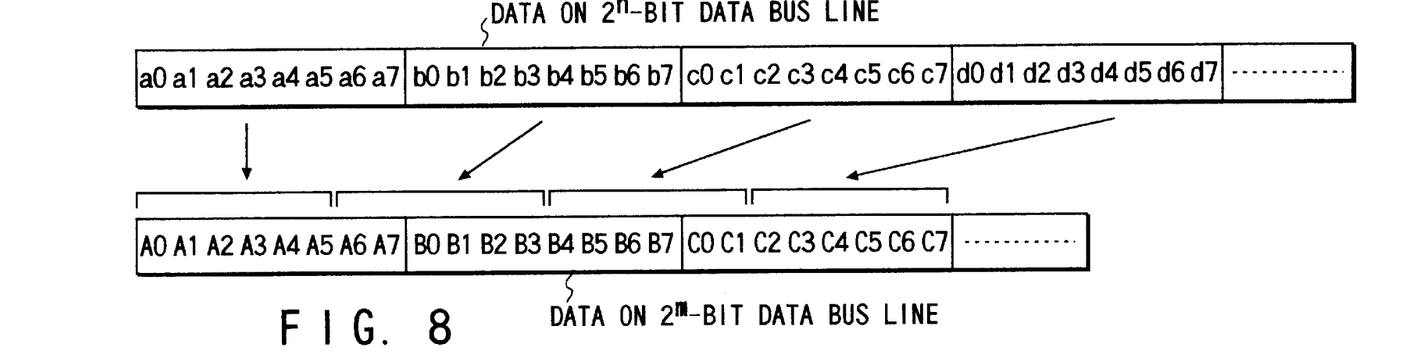
FIG. 8 is a diagram explaining how data to be read is converted in the memory system of FIG. 1.

FIG. 8 is a diagram explaining how data to be read is converted in the card control circuit 3 in the case where m=n=3. An 8-bit binary data item (bits a0 to a7) to be read is input to the flash memory interface 9. Of the eight bits a0 to a7, the bits a0 to a3 are converted to a 3-bit binary data item consisting of bits A0 to A2. The bits a4 to a7 are converted to a 3-bit binary data item consisting of bits A3 to A5. An 8-bit binary data item (bits b0 to b7) to be read is input to the flash memory interface 9. Of these eight bits b0 to b7, the bits b0 to b3 are converted to a 3-bit binary data item consisting of bits A6, A7 and B0.

The bits A0 to A7 constituting an 8-bit binary data are concurrently output from the card I/O interface 7. Bits B1 to B3 are converted from bits c4 to c7, bits B4 to B6 from bits c0 to c3, and bits B7, C0 and C1 from bits d0 to d4. The binary data to be read, which is input to the flash memory interface, are converted with high efficiency to binary data which will be output from the card I/O interface 7, in units of eight bits.

The data memory circuit 8 is used, thereby combining the binary data items converted from the $2^n$ binary data items to be read. It is therefore possible to output the binary data, in units of $2^m$ data items. Each 8-bit binary data item can be converted into two 4-bit data items or four 2-bit data items, which are concurrently output to the flash memory interface 9. In other words, m may not be equal to n (m≠n). The present invention can be reduced to practice, as long as m is a natural number and n is a non-negative integer.

Figure 9:
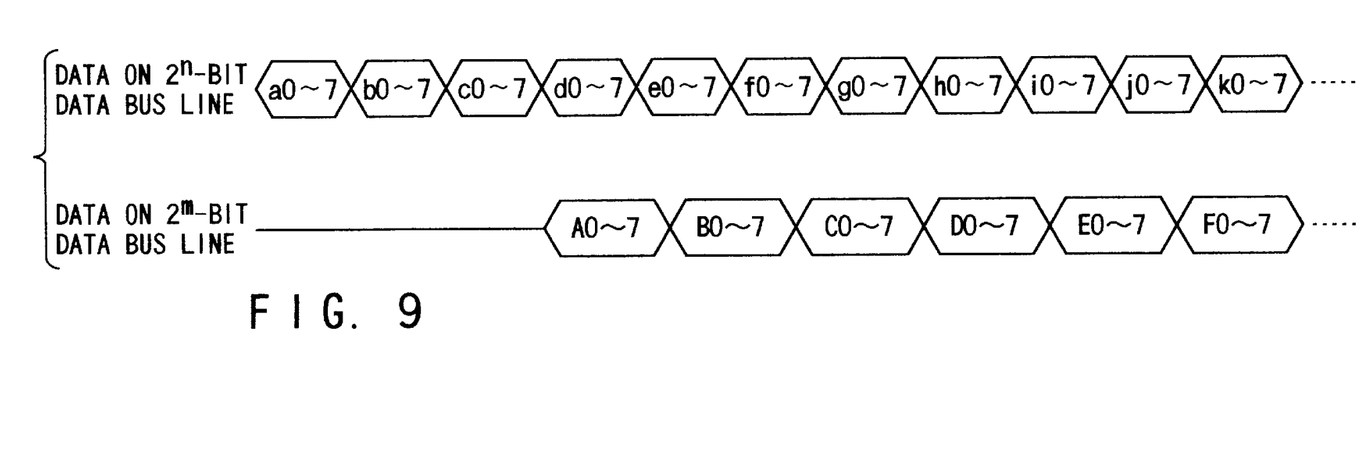
FIG. 9 is a timing chart illustrating when data is converted in the memory system of FIG. 1.

FIG. 9 is a timing chart illustrating when binary data to be read is converted in the card control circuit 3 in the case where m=n=3 like as FIG. 8. First, bits a0 to a7 are concurrently input to the flash memory interface 9. Then, bits b0 to b7, bits c0 to c7, bits d0 to d7, and so on, are concurrently input to the flash memory interface 9. After bits a0 to a7 and bits b0 to b7 have been input, an 8-bit binary data item consisting of bits A0 to A7 is output from the card I/O interface 7. After bits c0 to c7 have been input, an 8-bit binary data item consisting of bits B0 to B7 is output from the card I/O interface 7. The following operation is the same as above and the explanation will be omitted.

The cycle of outputting data from the card I/O interface 7 and the cycle of inputting data to the flash memory interface 9 are adjusted as shown in FIG. 9. The time required for output all binary data items and the time required to input all binary data items to be written can be equalized.

Figure 10:
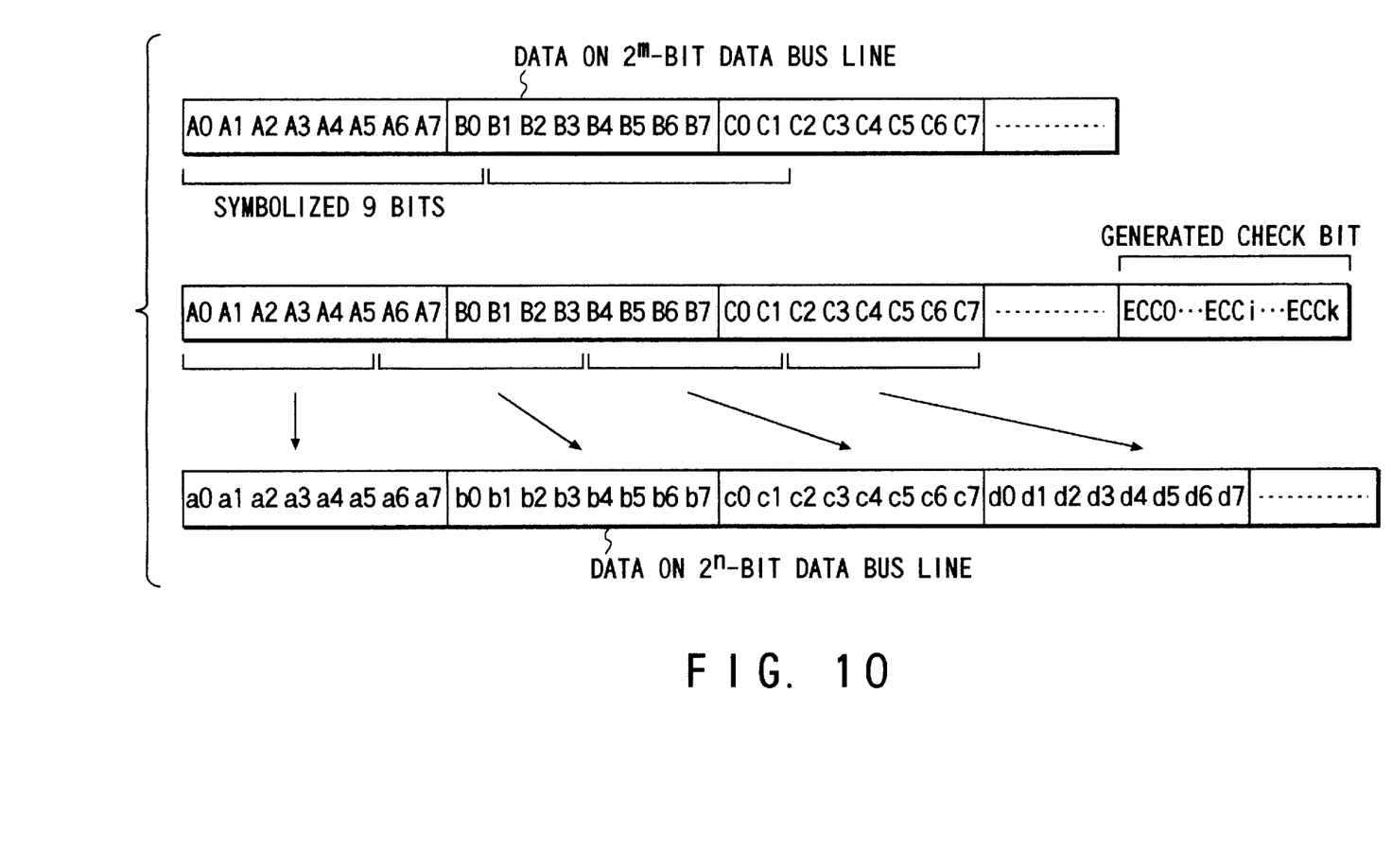
FIG. 10 is a diagram explaining how check bits are generated in the memory system of FIG. 1.

FIG. 10 is a diagram explaining how check bits are generated when the data read contains errors.

Check bits are generated from binary data by the card control circuit 3. The check bits are converted to binary data to be written. The check bits in the form of binary data is input to the flash memory 5 and stored into the memory cell array 20, along with the binary data which has been converted from ordinary binary data. In this case, any binary data item is a 9-bit symbol, from which the check bits ECC0 to ECCk are generated.

If each memory cell is to store a three-value data item, the efficiency of saving erroneous binary data items will be high, provided that each symbol consists of 3k (k is 1, 2, 3, . . . ) To generate check bits on the basis of a 2sRS (Read Solomon) code which can correct t symbols, at most (2s-1) symbols can be generated, each being a combination of a binary data item and check bits. In this case, 2t check bits are generated. If t≦27 and s=9, each binary data item consists of 4096 bits (512 bytes). This scheme is desirable for a three-value data storing memory which is compatible with a hard disk drive wherein 4096 bits (512 bytes) are recorded on each sector of the hard disk. Usually, t<27, because 4096 bits include sector management data items. In a three-value data storing memory wherein one sector holds 8192 bits (1 kbytes), s=12.

Figure 11:
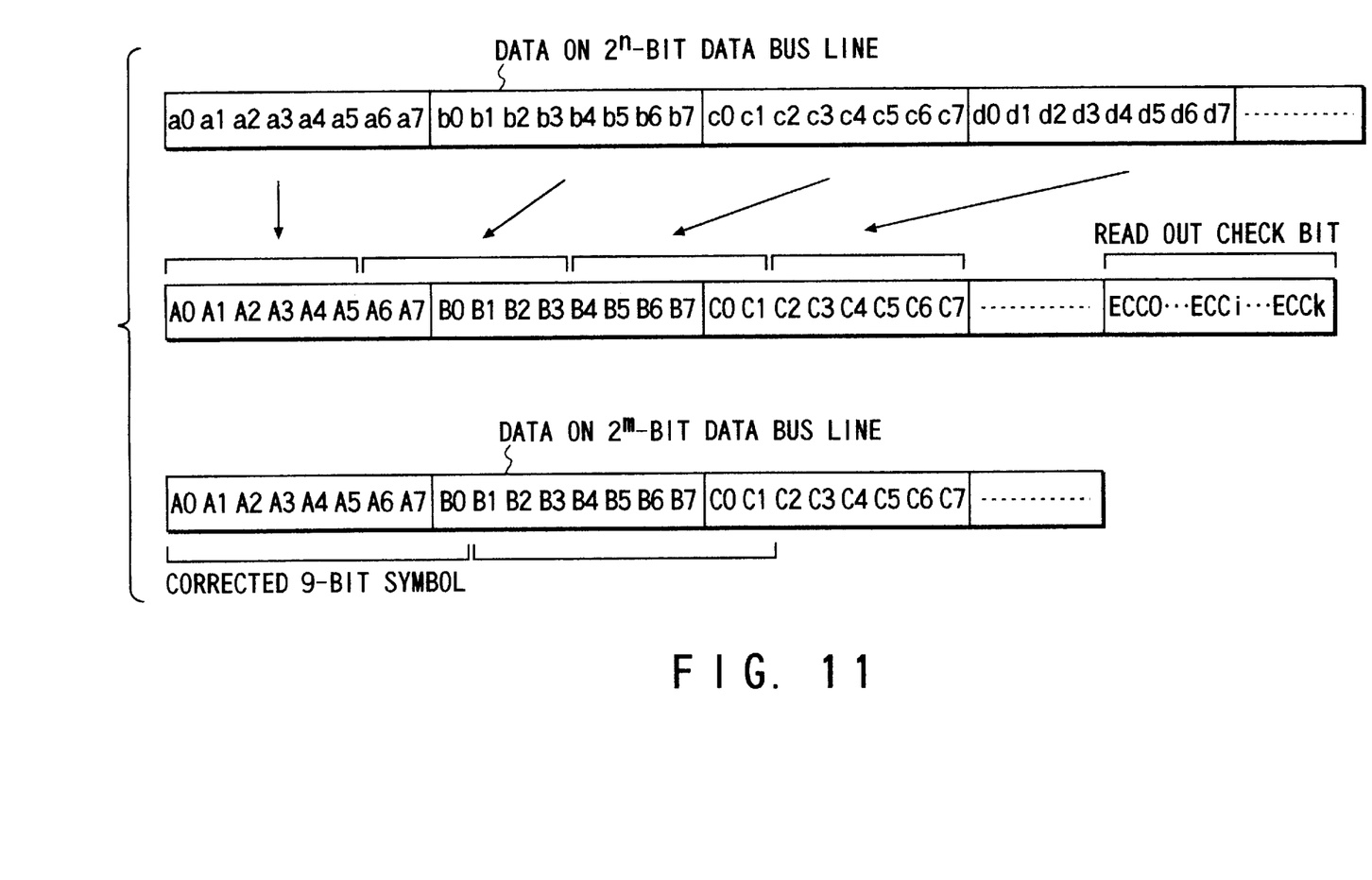
FIG. 11 is a diagram explaining how incorrect data is corrected in the memory system of FIG. 1.

FIG. 11 is a diagram explaining how an incorrect binary data item, if read out, is corrected. The incorrect binary data item is corrected on the basis of the binary data item and check bits which have been converted from that incorrect binary data item read out. More precisely, 9-bit binary data items are checked and corrected, one by one. Four 9-bit symbols can be corrected by using a $2^9$RS (Read Solomon) code which can correct four symbols. The number of bits constituting each symbol is a multiple of 3. Hence, the erroneous binary data items can be saved with high efficiency since it is quite rare that two symbols become erroneous when one memory cell is destroyed.

As described above, according to the embodiment, the card control circuit 3 processes a plurality of binary data items input to the card I/O interface 7 from the CPU 1, in units of three items. The circuit 3 converts the three binary data items of each unit, to four binary data items. The four binary data items thus converted from the three binary data items are output from the flash memory interface 9, in units of eight data items, and are eventually written into the flash memory 5. On the other hand, the card control circuit 3 processes a plurality of binary data items input to the flash memory interface 9, in units of four items. The circuit 3 converts the four binary data items, to three binary data items. The three binary data items thus converted from the four binary data items are output from the card I/O interface 7, in units of eight data items.

The data I/O interface 17 of each flash memory 5 receives binary data to be written into the memory cell array 20 and supplies binary data read from the array 20. The memory cell array 20 has memory cells arranged in rows and columns, each for assuming one of three data-storing states which are defined by two binary data items input to the data I/O interface 17. In the flash memory 5, the bit line control circuit 16 and the word line control circuit 21 constitute a data-reading circuit. The data-reading circuit detects the data-storing state which each memory cell assumes.

The three-value data storing semiconductor memory system according to the present invention comprises, among other components, memory cell arrays and an error-correction control circuit. Each memory cell array has a memory section which has memory cells, which can store three-value data, arranged in rows and columns, for storing data signals and check signals. The error-correction control circuit is designed to generate check binary data items from the binary data stored in the memory cells, to detect whether each binary data item is erroneous or not, and to correct an erroneous binary data item, if any, in accordance with the check binary data item associated with the erroneous binary data item. To be more specific, the error-correction control circuit (i.e., the card control circuit 3 in the system of FIG. 1) decomposes the binary data stored in the memory cells, into symbols each consisting of 3k bits (k is 1, 2, 3, . . . ) symbols and stored in the memory cells. The error-correction control circuit determines whether the symbols are erroneous or not, and corrects any erroneous symbol found, in accordance with the associated check binary data item.

Hence, the present invention can provide a three-value data storing semiconductor memory system which comprises three-value data storing memories each having no complex data-converting circuits and yet having a sufficient data compression ratio, and which can therefore operate with high reliability.

The present invention is not limited to the embodiment described above, in which the three-value data storing memories are flash memories. The present invention can be applied to a three-value storing memory system in which DRAMs, SRAMs or the like are used to store three-value data items.

In the embodiment described above, a plurality of binary data items of a first type input to the first I/O interface are processed in units of three items, the three binary data items of each unit are converted to four binary data items of a third type, and the binary data items of the third type are output from the second I/O interface, in units of eight data items, to be written the memory cells. Instead, it is possible to process the binary data items of the first type in units of 3k data items (k=1, 2, 3, . . . ), to convert them to 4k binary data items of the third type, to output the binary data items of the third type from the second I/O interface in units of $2^n$ data items. Alternatively, the binary data items of the first type may be processed in units of 4k ($=2^n$) data items, thus at a higher speed.

In the embodiment described above, a plurality of binary data items read out from any one of the flash memories and input to the second I/O interface are processed in units of four items, the four binary data items of each unit are converted to three binary data items, and the binary data items thus converted are output from the first I/O interface, in units of eight data items. Instead, it is possible to process the binary data items of the second type input to the second I/O interface, in units of 4h data items (h=1, 2, 3, . . . ), to convert the 4h data items of each unit to 3h binary data items of the fourth type, and to output the binary data items of the fourth type from the first I/O interface in units of $2^m$ data items. Alternatively, the binary data items of the second type may be processed in units of 4h ($=2^n$) data items, thus at a higher speed.

Other various changes and modifications can be made, without departing the scope and spirit of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A three-value data storing semiconductor memory system having a plurality of memory cells capable of storing a three-value data item, said system comprising:
    a first interface for receiving a plurality of binary data items of a first type, each including $2^m$ binary data items (m=1, 2, 3, . . . ), from an external device;
    a control circuit for processing the binary data items of the first type input to said first interface, in units of 3k data items (k 1, 2, 3, ..), converting each data unit consisting of 3k data items, to 4k binary data items of a third type, and outputting the binary data items of the third type in units of $2^n$ binary data items (n=0, 1, 2, 3, . . . ) as binary data items of a second type via a second interface.

2. A system according to claim 1, in which each of said memory cells stores one of three data-storing states, and further comprising:
    a third interface for receiving the binary data items of the second type;
    a memory cell array having said memory cells arranged in rows and columns; and
    a writing circuit for writing data items to the memory cells based on two of said binary data items of the second type.

3. A system according to claim 2, wherein said third interface receives and supplies the $2^n$ binary data items of the second type concurrently.

4. A system according to claim 1, wherein the binary data items of the third type converted from 3k binary data items of the first type are provided in the same number as the binary data items of the second type concurrently output through said second interface ($4k=2^n$).

5. A system according to claim 1, wherein the binary data items of the first type input through said first interface are provided in the same number as the binary data items of the second type concurrently output through said second interface (n=m≠0).

6. A system according to claim 1, further comprising a plurality of memory devices including said memory cells, wherein said control circuit arranged commonly corresponding to said plurality of the memory devices.

7. A system according to claim 1, wherein two of said memory cells store three bit data.

8. A three-value data storing semiconductor memory system having a plurality of memory cells capable of storing a three-value data item, said system comprising:
    a first interface for concurrently receiving a plurality of binary data items of a first type, each including $2^n$ binary data items (n=0, 1, 2, 3, . . . ), from said memory cells;
    a control circuit for processing the binary data items of the first type input to said first interface, in units of 4h data items (h=1, 2, 3, . . . ), converting each data unit consisting of 4h data items, to 3h binary data items of a third type, and outputting the binary data items of the third type in units of $2^m$ binary data items (m=0, 1, 2, 3, . . . ) as binary data items of a second type via a second interface to an external device.

9. A system according to claim 8, in which each of said memory cells stores one of three data-storing states, and further comprising:
    a memory cell array having said memory cells arranged in rows and columns; and
    a reading circuit for detecting the data-storing states of said memory cells and generating the binary data items of the first type which represent the data-storing states detected; and
    a third interface for outputting the binary data items of the first type to the first interface.

10. A system according to claim 9, wherein said third interface receives and supplies the $2^n$ binary data items of the first type concurrently.

11. A system according to claim 8, wherein the binary data items of the first type converted to the 3h binary data items of the third type are provided in the same number as the binary data items of the first type concurrently input through said first interface ($4h=2^n$).

12. A system according to claim 8, wherein the binary data items of the first type input through said first interface are provided in the same number as the binary data items of the second type concurrently output through said second interface (n=m≠0).

13. A system according to claim 8, further comprising a plurality of memory devices including said memory cells, wherein said control circuit arranged commonly corresponding to said plurality of the memory devices.

14. A system according to claim 8, wherein two of said memory cells store three bit data.

15. A three-value data storing semiconductor memory system comprising:

a memory cell array having a memory section which comprises a plurality of memory cells capable of storing a three-value data item and arranged in rows and columns, for storing data signals and check signals; and a error-correction control circuit for generating check binary data items from a plurality of binary data items to be stored in said memory cells, for detecting whether any binary data item read from said memory section is erroneous in accordance with the binary data items and the check binary data items, and for correcting any binary data that has been found to be erroneous, wherein said error-correction control circuit decomposes a plurality of binary data items to be stored in said memory cells to a plurality of symbols in a unit of three times bit length, generates a plurality of check binary data items to be stored in said memory cells, and detects and corrects data items in a unit of said symbols according to the binary data items and the check binary data items read from said memory cells.

16. A system according to claim 15, wherein said error-correction control circuit generates the check binary data items on the basis of a $2^9$RS (Read Solomon) code in which one symbol is constituted by nine bits, and detects and corrects an erroneous binary data item by using a 9-bit symbol.

17. A system according to claim 16, wherein the binary data items have a bit length greater than 4096 bits.

18. A system according to claim 15, wherein said error-correction control circuit generates the check binary data items on the basis of a $2^{12}$RS (Read Solomon) code in which one symbol is constituted by 12 bits, and detects and corrects an erroneous binary data item by using a 12-bit symbol.

19. A system according to claim 18, wherein the binary data items have a bit length greater than 8192 bits.

20. A system according to claim 15, wherein two of memory cells store three bit data.

* * * * *